US010317470B2

(12) United States Patent
Dou et al.

(10) Patent No.: US 10,317,470 B2
(45) Date of Patent: Jun. 11, 2019

(54) METHOD AND DEVICE FOR DISPLAYING SOC OF BATTERY, AND ELECTRONIC EQUIPMENT THEREOF

(71) Applicant: ZTE Corporation, Shenzhen (CN)

(72) Inventors: Mingming Dou, Shenzhen (CN); Wen Li, Shenzhen (CN); Weiwei Hao, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 15/508,582

(22) PCT Filed: Nov. 12, 2014

(86) PCT No.: PCT/CN2014/090954
§ 371 (c)(1),
(2) Date: Mar. 3, 2017

(87) PCT Pub. No.: WO2016/033868
PCT Pub. Date: Mar. 10, 2016

(65) Prior Publication Data
US 2017/0285112 A1 Oct. 5, 2017

(30) Foreign Application Priority Data
Sep. 4, 2014 (CN) .......................... 2014 1 0448718

(51) Int. Cl.
*G01R 31/36* (2019.01)
*H02J 7/00* (2006.01)

(52) U.S. Cl.
CPC ......... *G01R 31/3646* (2019.01); *G01R 31/36* (2013.01); *G01R 31/3648* (2013.01);
(Continued)

(58) Field of Classification Search
None
See application file for complete search history.

(56) References Cited

U.S. PATENT DOCUMENTS 5,949,217 A * 9/1999 Okada ................ G01R 31/3655
320/132
6,311,080 B1 10/2001 Mochida
(Continued)

FOREIGN PATENT DOCUMENTS

CN 1299975 A 6/2001
CN 201360156 Y 12/2009
(Continued)

OTHER PUBLICATIONS

International Search Report for corresponding application PCT/CN2014/090954 filed on Nov. 12, 2014; dated Jun. 10, 2015.
(Continued)

*Primary Examiner* — Chico A Foxx
(74) *Attorney, Agent, or Firm* — Cantor Colburn LLP

(57) ABSTRACT

A method and device for displaying SOC of a battery, and electronic equipment are provided. The method includes: an initial voltage and initial SOC of the battery are acquired; a current voltage and current SOC of the battery in a current state are acquired after charging or discharging the battery for a preset time; and if the ratio of the current voltage to the initial voltage meets a first preset condition and the ratio of the current SOC to the initial SOC meets a second preset condition, the current voltage and the current SOC are displayed.

16 Claims, 7 Drawing Sheets

(52) U.S. Cl.
CPC .............. *H02J 7/00* (2013.01); *H02J 7/0047* (2013.01); *H02J 2007/005* (2013.01)

(56) References Cited

U.S. PATENT DOCUMENTS

| | | | | |
|---|---|---|---|---|
| 7,683,581 | B2 * | 3/2010 | Wong | G01R 31/361 320/132 |
| 8,253,380 | B2 * | 8/2012 | Sun | G01R 31/3651 320/128 |
| 2006/0158155 | A1 * | 7/2006 | Tamezane | G01R 31/3651 320/132 |
| 2008/0007221 | A1 * | 1/2008 | Lee | G01R 31/3648 320/128 |
| 2008/0077338 | A1 * | 3/2008 | Wong | G01R 31/361 702/63 |
| 2010/0072948 | A1 * | 3/2010 | Sun | G01R 31/3651 320/134 |
| 2012/0045673 | A1 * | 2/2012 | Lee | H01M 10/482 429/92 |
| 2013/0099724 | A1 * | 4/2013 | Rich | H02J 7/00 320/106 |
| 2013/0106426 | A1 * | 5/2013 | Kim | G01R 31/362 324/428 |
| 2013/0138370 | A1 * | 5/2013 | Oh | G01R 31/3624 702/63 |
| 2014/0156209 | A1 | 6/2014 | Yuan | |
| 2014/0232411 | A1 * | 8/2014 | Vaidya | G01R 31/3624 324/426 |
| 2015/0032394 | A1 * | 1/2015 | Kimura | G01R 31/362 702/63 |
| 2015/0046105 | A1 * | 2/2015 | Guntreddi | G01R 31/362 702/63 |
| 2015/0131461 | A1 * | 5/2015 | Ramkumar | H04W 52/0251 370/311 |
| 2015/0237438 | A1 * | 8/2015 | Lee | H04R 1/1091 381/74 |
| 2015/0253835 | A1 * | 9/2015 | Yu | G06F 1/3206 713/323 |
| 2017/0126052 | A1 * | 5/2017 | Toki | H02J 7/045 |

FOREIGN PATENT DOCUMENTS

| | | |
|---|---|---|
| CN | 102508169 A | 6/2012 |
| CN | 102830361 A | 12/2012 |
| CN | 102998622 A | 3/2013 |
| CN | 103064025 A | 4/2013 |
| CN | 103076571 A | 5/2013 |
| CN | 103605077 A | 2/2014 |
| CN | 103675701 A | 3/2014 |
| CN | 103809125 A | 5/2014 |
| CN | 103855747 A | 6/2014 |
| DE | 19917473 A1 | 10/2000 |
| JP | 2003132959 A | 5/2003 |
| JP | 2004168126 A | 6/2004 |
| WO | 2014046232 A1 | 3/2014 |

OTHER PUBLICATIONS

European Search Report for corresponding application EP 14 90 1225; Report dated Aug. 28, 2017.

* cited by examiner

METHOD AND DEVICE FOR DISPLAYING SOC OF BATTERY, AND ELECTRONIC EQUIPMENT THEREOF

TECHNICAL FIELD

The present disclosure relates to the technical field of computers, and more particularly to a method and device for displaying the SOC of a battery, and electronic equipment.

BACKGROUND

Intelligent terminal, which is represented by mobile phones, has become increasingly popular, and in the process of using of the intelligent terminal, users also make higher requirements in terms of industrial design, user interface design, application friendliness, security and flows of operating systems, multimedia, self-supporting power consumption and the like.

In terms of self-supporting power consumption, the power consumption is required to be reduced to improve self-supporting capability on one hand, and on the other hand, the current State-Of-Charge (SOC) and time for self-supporting are also required to be accurately reported to the user to help the user to timely and accurately know about the self-supporting power consumption condition. Generally, SOC calculation is implemented by a voltameter chip. A basic theory is that the SOC of a battery is acquired through voltage acquisition (VADC) and current acquisition (IADC), and the consumed or acquired SOC is acquired according to $Q=\int T \times d_t$ the SOC in a time period is equal to an integral of current to the time period), thereby a current SOC is obtained.

In the conventional art, an additional voltameter chip is required to acquire the SOC of a battery. Therefore, cost may be increased on one hand, and on the other hand, the voltameter chip may also occupy a valuable arrangement space on a Printed Circuit Board (PCB).

SUMMARY

Embodiments of the present disclosure provide a method and device for displaying SOC of a battery and electronic equipment, which implement accurate calculation of the SOC of the battery without an additional voltameter chip, saves a valuable arrangement space on a PCB and reduces cost.

In order to solve the technical problem, the technical solutions of the present disclosure are implemented as follows.

According to an aspect of the present disclosure, a method for displaying SOC of a battery is provided, which may include that: an initial voltage and initial SOC of the battery are acquired; a current voltage and current SOC of the battery in a current state are acquired after charging or discharging the battery for a preset time; and if the ratio of the current voltage to the initial voltage meets a first preset condition and the ratio of the current SOC to the initial SOC meets a second preset condition, the current voltage and the current SOC are displayed.

Preferably, the method may further include that: if the first preset condition is met and the second preset condition is not met, the current voltage is utilized as a displayed voltage, and a second limit value is utilized as a displayed SOC.

Preferably, the method may further include that: if the second preset condition is met and the first preset condition is not met, a first limit value is utilized as the displayed voltage, and the current SOC is utilized as the displayed SOC.

Preferably, the step that the initial voltage and initial SOC of the battery are acquired may further include that: the initial voltage of the battery is acquired through an SOC Management Integrated Circuit (PMIC); and an initial SOC corresponding to the initial voltage is acquired according to a preset corresponding relationship between a voltage and an SOC.

Preferably, the step that the current voltage and current SOC of the battery in the current state are acquired after charging or discharging the battery for the preset time may further include that: the current voltage of the battery in the current state is acquired through the PMIC after charging or discharging the battery for the preset time; and a current SOC corresponding to the current voltage is acquired according to the preset corresponding relationship between the voltage and the SOC.

Preferably, the step that the current voltage and current SOC of the battery in the current state are acquired after charging the battery for the preset time may further include that: a difference value corresponding to the acquired current voltage is matched according to a preset corresponding relationship between a difference value and a voltage; the acquired current voltage is corrected to obtain a corrected current voltage according to the matched difference value; and the step that the current SOC corresponding to the current voltage is acquired according to the preset corresponding relationship between the voltage and the SOC may further be implemented as follows: a current SOC corresponding to the corrected current voltage is acquired according to the preset corresponding relationship between the voltage and the SOC.

Preferably, in a charging stage of the battery, the method may further include that: the current SOC and the initial SOC are compared; if the current SOC is smaller than the initial SOC, multiple current SOCs of the battery are continuously acquired according to a preset period; the multiple current SOCs with the initial SOC are compared; and if all the multiple current SOCs are smaller than the initial SOC, the latest current SOC is displayed.

Preferably, in a discharging stage of the battery, the method may further include that: the current SOC and the initial SOC are compared; if the current SOC is larger than the initial SOC, multiple current SOCs of the battery are continuously acquired according to a preset period; the multiple current SOCs and the initial SOC are compared; and if all the multiple current SOCs are larger than the initial SOC, the latest current SOC is displayed.

According to another aspect of the present disclosure, a device for displaying SOC of a battery is further provided, which may include: a first acquisition module, configured to acquire an initial voltage and initial SOC of the battery; a second acquisition module, configured to acquire a current voltage and current SOC of the battery in a current state after charging or discharging the battery for a preset time; and a display module, configured to, if the ratio of the current voltage to the initial voltage meets a first preset condition and the ratio of the current SOC to the initial SOC meets a second preset condition, display the current voltage and the current SOC.

Preferably, the device may further include: a voltage correction module, configured to, if the first preset condition is met and the second preset condition is not met, utilize the current voltage as a displayed voltage, and utilize a second limit value as a displayed SOC.

Preferably, the device may further include: an SOC correction module, configured to, if the second preset condition is met and the first preset condition is not met, utilize a first limit value as the displayed voltage, and utilize the current SOC as the displayed SOC.

Preferably, the first acquisition module may include: an initial voltage acquisition unit, configured to acquire the initial voltage of the battery through a PMIC; and an initial SOC acquisition unit, configured to acquire an initial SOC corresponding to the initial voltage according to a preset corresponding relationship between a voltage and an SOC.

Preferably, the second acquisition module may include: a current voltage acquisition unit, configured to acquire the current voltage of the battery in the current state through the PMIC after charging or discharging the battery for the preset time; and a current SOC acquisition unit, configured to acquire a current SOC corresponding to the current voltage according to the preset corresponding relationship between the voltage and the SOC.

Preferably, the second acquisition module may further include: a difference value acquisition unit, configured to match a difference value corresponding to the acquired current voltage according to a preset corresponding relationship between a difference value and a voltage; a voltage correction unit, configured to correct, according to the matched difference value, the acquired current voltage to obtain a corrected current voltage; and the current SOC acquisition unit may further be configured to acquire a current SOC corresponding to the corrected current voltage according to the preset corresponding relationship between the voltage and the SOC.

Preferably, in a charging stage of the battery, the device may further include: a charging control module, configured to compare the current SOC with the initial SOC; if the current SOC is smaller than the initial SOC, continuously acquire multiple current SOCs of the battery according to a preset period; compare the multiple current SOCs with the initial SOC; and if all the multiple current SOCs are smaller than the initial SOC, display the latest current SOC.

Preferably, in a discharging stage of the battery, the device may further include: a discharging control module, configured to compare the current SOC with the initial SOC; if the current SOC is larger than the initial SOC, continuously acquire multiple current SOCs of the battery according to a preset period; compare the multiple current SOCs with the initial SOC; and if all the multiple current SOCs are larger than the initial SOC, display the latest current SOC.

According to another embodiment of the present disclosure, electronic equipment is further provided, which may include the abovementioned device for displaying the SOC of the battery.

The present disclosure has the following beneficial effects: the SOC of the battery is obtained according to a corresponding relationship of voltage and SOC changes of the battery in charging and discharging processes of the battery, so that accurate calculation of the SOC of the battery of a terminal is implemented without an additional hardware circuit such as a voltameter chip, and cost is reduced; and meanwhile, no voltameter chip is required, so that a valuable PCB arrangement space in terminal equipment is saved, the cost is further reduced, and a degree of freedom of hardware design and competitiveness of a product are increased.

DETAILED DESCRIPTION OF THE EMBODIMENTS

Figure 1:
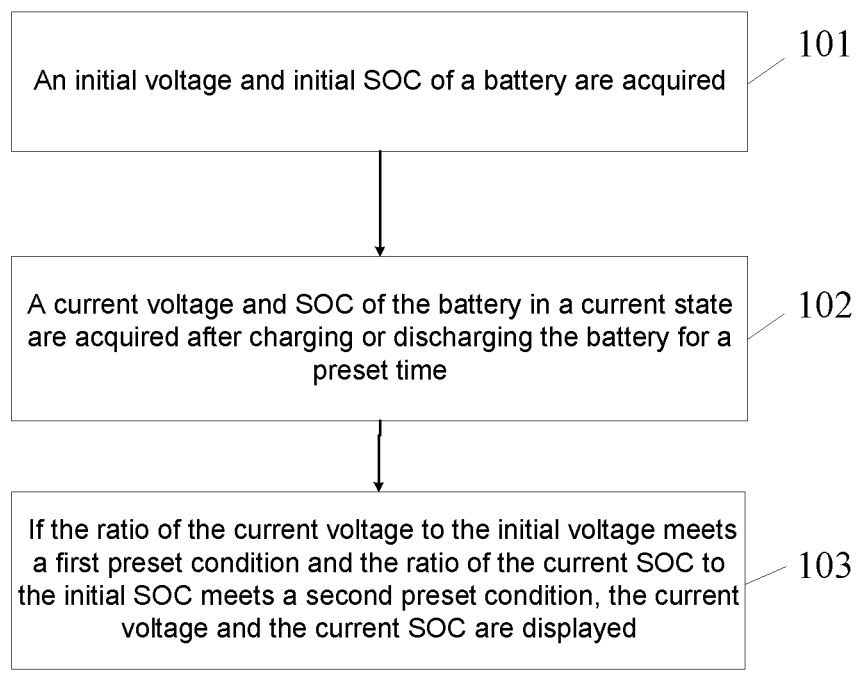
FIG. 1 is a flowchart of a method for displaying SOC of a battery according to an embodiment of the present disclosure.

Exemplary embodiments of the present disclosure will be described below with reference to the drawings in more detail. Although the exemplary embodiments of the present disclosure are shown in the drawings, it should be understood that the present disclosure may be implemented in various forms and should not be limited by the embodiments elaborated herein. Instead, these embodiments are provided to make the present disclosure understood more thoroughly and completely transmit the scope of the present disclosure to those skilled in the art.

Embodiment 1

FIG. 1 is a flowchart of a method for displaying SOC of a battery according to an embodiment of the present disclosure. The method includes the following steps.

Step 101: an initial voltage and initial SOC of the battery are acquired.

Preferably, a state at any time is an initial state, and a voltage at the initial state is the initial voltage. In the embodiment of the present disclosure, an SOC-on voltage during SOC-on of terminal equipment may be selected as an initial voltage, and then a corresponding initial SOC is acquired according to the initial voltage, wherein the initial SOC may be a percentage.

Figure 2:
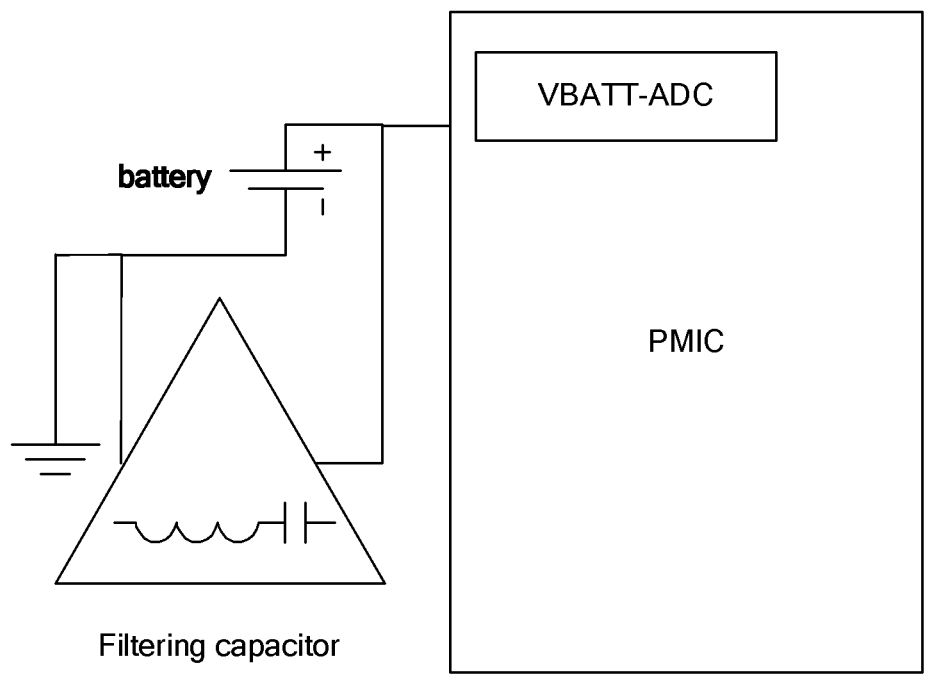
FIG. 2 is a schematic circuit diagram of acquiring an initial voltage of a battery according to an embodiment of the present disclosure.

Furthermore, implementation of a method for acquiring the initial voltage and the initial SOC, specifically referring to FIG. 2, includes that:

the initial voltage of the battery is acquired through a PMIC;

an initial SOC corresponding to the initial voltage is acquired according to a preset corresponding relationship between a voltage and SOC.

Preferably, the preset corresponding relationship between the voltage and the SOC is calculated by multiple sampling.

Step 102: a current voltage and current SOC of the battery in a current state are acquired after charging or discharging the battery for a preset time.

Specifically, the preset time may be one minute or two minutes, and in the embodiment of the present disclosure, the specific time length of the preset time is not limited.

Figure 3:
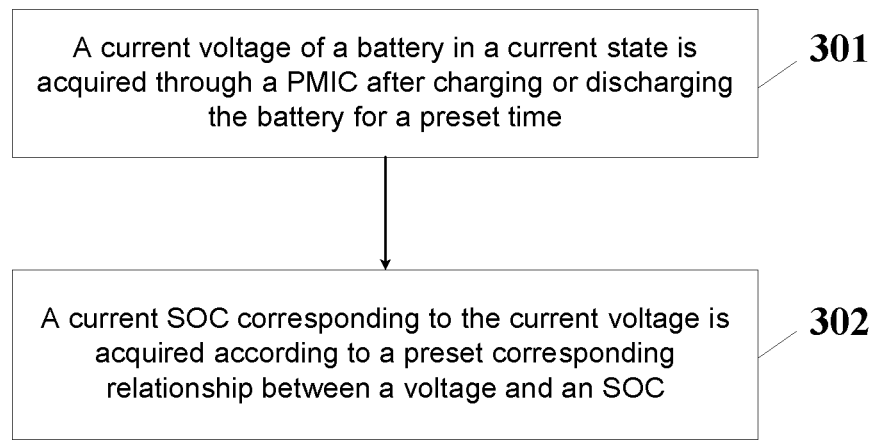
FIG. 3 is a first flowchart of charging and discharging SOC calibration according to an embodiment of the present disclosure.

Furthermore, implementation of a method for acquiring the initial voltage and the initial SOC, specifically referring to FIG. 3, includes:

Step 301: the current voltage of the battery in the current state is acquired through the PMIC after charging or discharging the battery for the preset time; and Step 302: a current SOC corresponding to the current voltage is acquired according to a preset corresponding relationship between a voltage and an SOC, wherein the current SOC may be a percentage.

In the embodiment, the SOC may be corrected according to a charging and discharging SOC calibration strategy, that is, the step that the current voltage and current SOC of the battery in the current state are acquired after charging for the preset time further includes that: a difference value corresponding to the acquired current voltage is matched according to a preset corresponding relationship between a difference value and a voltage; and correspondingly, Step 302 is further implemented as follows: a current SOC corresponding to the corrected current voltage is acquired according to the preset corresponding relationship between the voltage and the SOC.

Figure 4:
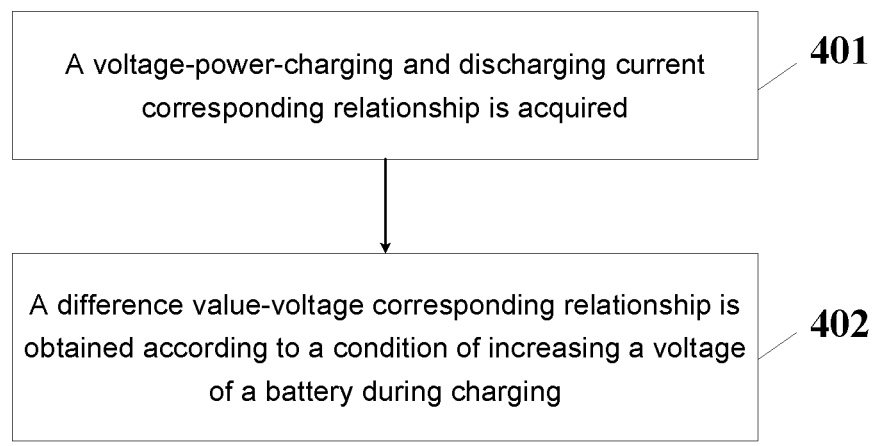
FIG. 4 is a flowchart of a charging and discharging SOC calibration strategy according to an embodiment of the present disclosure.

In the embodiment, the corresponding relationship between the difference value and the voltage may be established in the following manner. FIG. 4 is a flowchart of a charging and discharging SOC calibration strategy according to the embodiment. The flow includes:

Step 401: a voltage-SOC-charging and discharging current corresponding relationship is acquired; and Step 402: a difference value-voltage corresponding relationship is obtained according to a condition of increasing a voltage of the battery during charging, and the two corresponding relationships are adopted as basic data for SOC calculation.

Still refer to FIG. 1, Step 103: if the ratio of the current voltage to the initial voltage meets a first preset condition and the ratio of the current SOC to the initial SOC meets a second preset condition, the current voltage and the current SOC are displayed.

Preferably, the first preset condition refers to a voltage change limit strategy, and is further that: a rise or drop value of the voltage of the battery within a certain period of time may not exceed a first limit value, and if being exceeded, the first limit value is adopted for calculation, wherein the first limit value is preset.

Preferably, the second preset condition refers to an SOC change limit strategy. Specifically, a rise or drop value of SOC of the battery within a certain period of time may not exceed a second limit value, and if being exceeded, the second limit value is adopted for calculation, wherein the second limit value is preset.

That is, when a current rise value or drop value of the voltage of the battery does not exceed the first limit value and a current rise value or drop value of the SOC of the battery also does not exceed the second limit value, the current voltage and the current SOC are displayed, wherein the current SOC may be a percentage.

In the embodiment of the present disclosure, the SOC of the battery is obtained according to a corresponding relationship of voltage and SOC changes of the battery in charging and discharging processes of the battery, so that accurate calculation of the SOC of the battery of a terminal is implemented without an additional hardware circuit such as a voltameter chip, and cost is reduced; and meanwhile, no voltameter chip is required, so that a valuable space on a PCB is saved, and competitiveness of a product is increased.

Furthermore, the method further includes that: if the acquired current voltage of the battery in the current state meets the first preset condition and the current SOC does not meet the second preset condition, the current SOC of the battery is corrected by virtue of the second preset limit value, and the corrected current SOC is displayed.

Furthermore, the method further includes that: if the acquired current SOC of the battery in the current state meets the second preset condition and the current voltage does not meet the first preset condition, the current voltage of the battery is corrected by virtue of the first preset limit value.

Furthermore, in a charging stage of the battery, the method further includes that: the current SOC and the initial SOC are compared;

if the current SOC is smaller than the initial SOC, multiple current SOCs of the battery are continuously acquired according to a preset period;

the multiple current SOCs and the initial SOC are compared; and if all the multiple current SOCs are smaller than the initial SOC, the latest current SOC is displayed.

Furthermore, in a discharging stage of the battery, the method further includes that: the current SOC and the initial SOC are compared;

if the current SOC is larger than the initial SOC, multiple current SOCs of the battery are continuously acquired according to a preset period;

the multiple current SOCs and the initial SOC are compared; and if all the multiple current SOCs are larger than the initial SOC, the latest current SOC is displayed.

Figure 5:
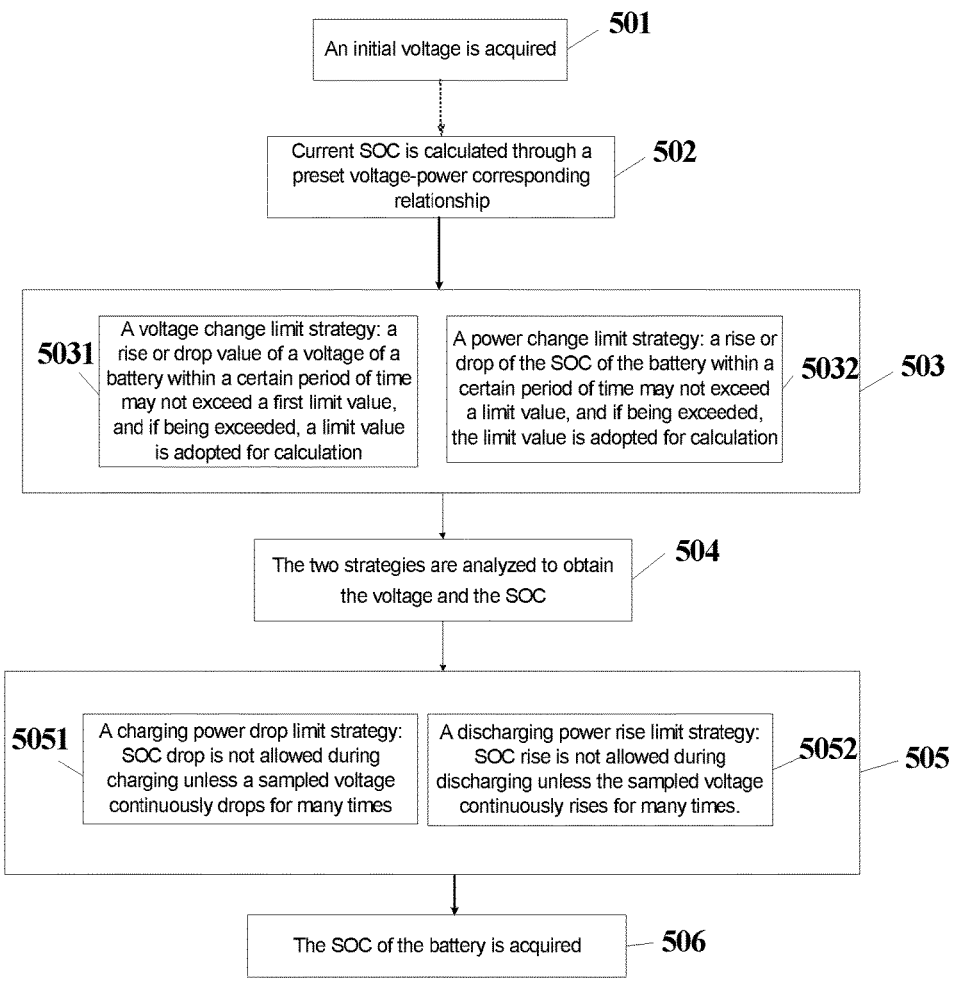
FIG. 5 is a second flowchart of charging and discharging SOC calibration according to an embodiment of the present disclosure.

FIG. 5 is a second flowchart of charging and discharging SOC calibration according to an embodiment of the present disclosure. The flow further includes the following steps.

Step 501: an initial voltage is acquired.

Step 502: current SOC is calculated through a preset voltage-SOC corresponding relationship.

Step 503: first charging and discharging SOC calibration is performed.

Specifically, the calibration includes:

Step 5031: a voltage change limit strategy: a rise or drop value of a voltage of a battery within a certain period of time may not exceed a first limit value, and if being exceeded, a limit value is adopted for calculation; and Step 5032: an SOC change limit strategy: a rise or drop value of SOC of the battery within a certain period of time may not exceed a limit value, and if being exceeded, the limit value is adopted for calculation.

Step 504: the two strategies are analyzed to obtain a voltage and an SOC.

Step 505: second charging and discharging SOC calibration is performed.

Specifically, the calibration includes:

Step 5051: a charging SOC drop limit strategy: SOC drop is not allowed during charging unless a sampled voltage continuously drops for many times; and Step 5052: a discharging SOC rise limit strategy: SOC rise is not allowed during discharging unless the sampled voltage continuously rises for many times.

Step 506: SOC of the battery is acquired.

Figure 6:
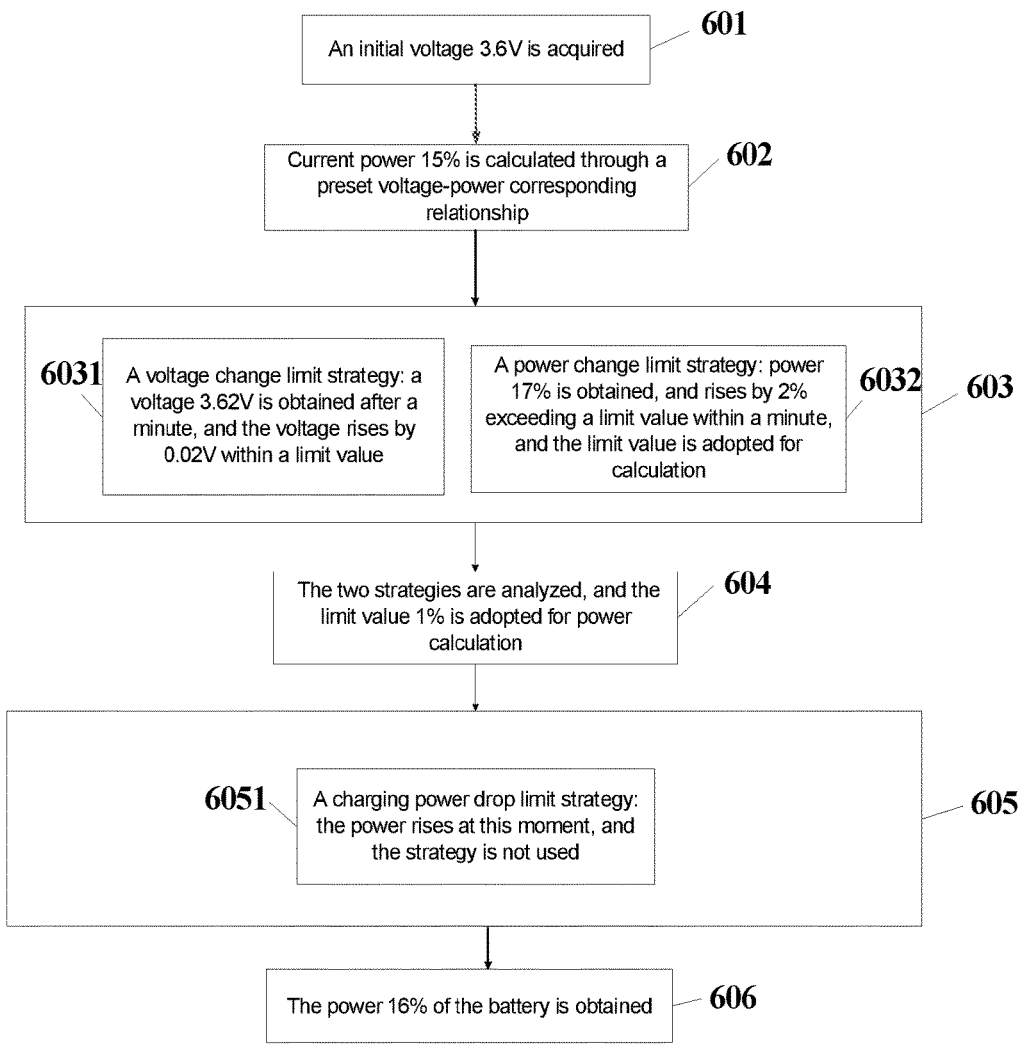
FIG. 6 is a first application diagram of a method for displaying SOC of a battery according to an embodiment of the present disclosure.

FIG. 6 is a first application diagram of a method for displaying SOC of a battery according to an embodiment of the present disclosure. FIG. 6 will be further introduced below.

FIG. 6 is an application diagram of a battery in a charging stage. In the embodiment, it is set that a rated current of a charger is 1 A and capacity of the battery is 1,500 mAh. Specific implementation of the application includes the following steps.

Step 601: an initial voltage 3.6V is acquired.

Specifically, acquisition is implemented through a PMIC.

Step 602: current SOC 15% is calculated through a preset voltage-SOC corresponding relationship.

Step 603: first charging and discharging calibration is performed, and charging is started. Specifically, the calibration includes:

Step 6031: a voltage change limit strategy: a voltage 3.62V is obtained after a minute, and the voltage rises by 0.02V within a limit value; and Step 6032: an SOC change limit strategy: SOC 17% is obtained at this moment, and rises by 2% exceeding a limit value within a minute, and the limit value is adopted for calculation.

Step 604: the two strategies are analyzed, and the limit value 1% is adopted for SOC calculation.

Calculation is specifically implemented as follows: in the embodiment, the standard charger is 1 A, and it is known that own current consumption of equipment is 0.1 A in a charging stage, so that a charging current is 0.9 A at this moment. At this moment, SOC rises by (0.9*1 min)/(1.5 A*60 min)=0.01, i.e. 1%, within a minute, so that a maximum rise limit within a minute is 5%, and the SOC 17% obtained in Step 6032 is corrected to be 16%.

Step 605: second charging and discharging SOC calibration is performed.

Specifically, the calibration includes:

Step 6051: a charging SOC drop limit strategy: the SOC rises at this moment, and the strategy is not used.

Step 606: the SOC 16% of the battery is obtained after a minute.

Furthermore, in the embodiment, if a current SOC (if being 14%) is smaller than an initial SOC (15%), multiple current SOCs of the battery are continuously acquired according to a preset period;

the multiple current SOCs and the initial SOC are compared; and if all the multiple current SOCs are smaller than the initial SOC, the latest current SOC is displayed.

Figure 7:
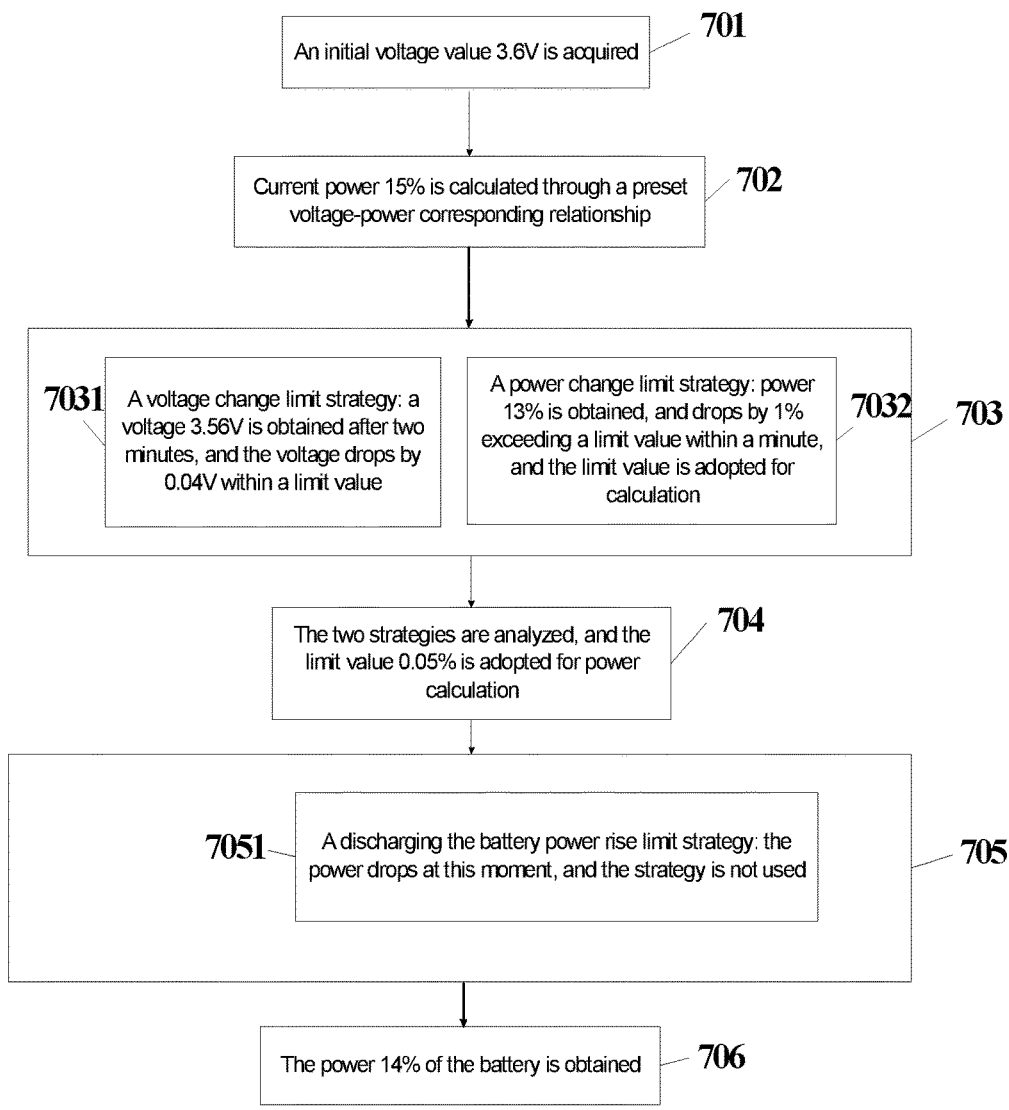
FIG. 7 is a second application diagram of a method for displaying SOC of a battery according to an embodiment of the present disclosure.

FIG. 7 is a second application diagram of a method for displaying SOC of a battery according to an embodiment of the present disclosure. FIG. 7 will be introduced below.

FIG. 7 is an application diagram of a battery during discharging. In the embodiment, it is set that a rated current of a charger is 1 A, capacity of the battery is 1,500 mAh and current consumption of a user high-load usage simulation scenario is 450 mA. Specific implementation is as follows.

Step 701: an initial voltage 3.6V is acquired.

Step 702: current SOC 15% is calculated through a preset voltage-SOC corresponding relationship.

Step 703: first charging and discharging calibration is performed, and discharging is started.

Specifically, the calibration includes:

Step 7031: a voltage change limit strategy: a voltage 3.56V is obtained after two minutes, and the voltage drops by 0.04V within a limit value; and Step 7032: an SOC change limit strategy: SOC 13% is obtained at this moment, and drops by 1% exceeding a limit value within a minute, and the limit value is adopted for calculation.

Step 704: the two strategies are analyzed, and the limit value 0.05% is adopted for SOC calculation.

Calculation is specifically implemented as follows: in the embodiment, the current consumption of the user heavy-load usage simulation scenario is 450 mA, and SOC drops by (0.45 A*1 min)/(1.5 A*60 min)=0.005, i.e. 0.5%, within a minute at this moment. Therefore, a maximum drop limit within a minute is 0.5%, and the SOC 13% obtained in Step 7032 is corrected to be 14%.

Step 705: second charging and discharging SOC calibration is performed.

Specifically, the calibration includes:

Step 7051: a discharging SOC rise limit strategy: the SOC drops at this moment, and the strategy is not used.

Step 706: the SOC 14% of the battery is obtained after two minutes.

Furthermore, in the embodiment, if a current SOC (if being 16%) is smaller than an initial SOC (15%), multiple current SOCs of the battery are continuously acquired according to a preset period;

the multiple current SOCs and the initial SOC are compared; and if all the multiple current SOCs are smaller than the initial SOC, the latest current SOC is displayed.

Embodiment 2

Corresponding to a method for displaying SOC of a battery in embodiment 1, the present disclosure further provides a device for displaying the SOC of the battery.

Figure 8:
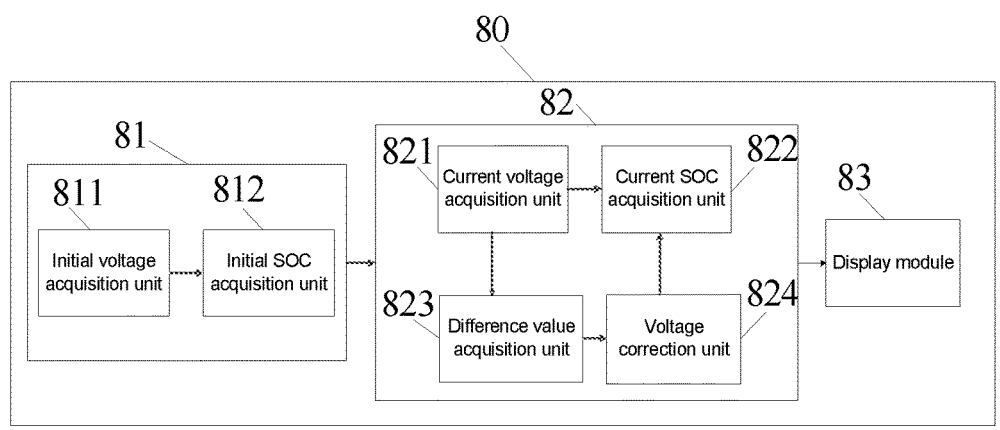
FIG. 8 is a block diagram of a device for displaying SOC of a battery according to an embodiment of the present disclosure.

As shown in FIG. 8, the device 80 for displaying the SOC of the battery includes:

a first acquisition module 81, configured to acquire an initial voltage and initial SOC of the battery.

Preferably, a state at any time is an initial state, and a voltage at the initial state is the initial voltage. In the embodiment of the present disclosure, an SOC-on voltage during SOC-on of terminal equipment may be selected as an initial voltage, and then a corresponding initial SOC is acquired according to the initial voltage.

Preferably, the first acquisition module 81 includes:

an initial voltage acquisition unit 811, configured to acquire the initial voltage of the battery through a PMIC; and an initial SOC acquisition unit 812, configured to acquire an initial SOC corresponding to the initial voltage according to a preset corresponding relationship between a voltage and SOC.

A second acquisition module 82 is configured to acquire a current voltage and current SOC of the battery in a current state after charging or discharging the battery for a preset time.

Preferably, the preset time may be one minute or two minutes, and in the embodiment of the present disclosure, a specific time length of the preset time is not limited.

Preferably, the second acquisition module 82 includes:

a current voltage acquisition unit 821, configured to acquire the current voltage of the battery in the current state through the PMIC after charging or discharging the battery for the pre-set time; and a current SOC acquisition unit 822, configured to acquire a current SOC corresponding to the current voltage according to the preset corresponding relationship between the voltage and the SOC.

Furthermore, after charging for the pre-set time, the second acquisition module 82 further includes:

a difference value acquisition unit 823, configured to match a difference value corresponding to the acquired current voltage according to a preset corresponding relationship between a difference value and a voltage;

a voltage correction unit 824, configured to correct, according to the matched difference value, the acquired current voltage to obtain a corrected current voltage; and the current SOC acquisition unit 822 is further configured to acquire a current SOC corresponding to the corrected current voltage according to the preset corresponding relationship between the voltage and the SOC.

A display module 83 is configured to, if the ratio of the current voltage to the initial voltage meets a first preset condition and the ratio of the current SOC to the initial SOC meets a second preset condition, display the current voltage and the current SOC.

Preferably, the first preset condition refers to that: a rise or drop value of a voltage of the battery within a certain period of time may not exceed a first limit value, and if being exceeded, the first limit value is adopted for calculation, wherein the first limit value is preset.

Preferably, the second preset condition refers to that: a rise or drop value of SOC of the battery within a certain period of time may not exceed a second limit value, and if being exceeded, the second limit value is adopted for calculation, wherein the second limit value is preset.

In the embodiment of the present disclosure, the SOC of the battery is obtained according to a corresponding relationship of voltage and SOC changes of the battery in charging and discharging processes of the battery, so that accurate calculation of the SOC of the battery of a terminal is implemented without an additional hardware circuit such as a voltameter chip, and cost is reduced; and meanwhile, no voltameter chip is used, so that a valuable space on a PCB is saved, and competitiveness of a product is increased.

Furthermore, the device 80 further includes:

a charging control module, configured to compare the current SOC with the initial SOC, if the current SOC is smaller than the initial SOC, continuously acquire multiple current SOCs of the battery according to a preset period, compare the multiple current SOCs with the initial SOC, and if all the multiple current SOCs are smaller than the initial SOC, display the latest current SOC; and a discharging control module, configured to compare the current SOC with the initial SOC, if the current SOC is larger than the initial SOC, continuously acquire multiple current SOCs of the battery according to a preset period, compare the multiple current SOCs with the initial SOC; and if all the multiple current SOCs are larger than the initial SOC, display the latest current SOC.

Embodiment 3

Corresponding to a device in embodiment 2, the embodiment of the present disclosure further provides electronic equipment, which includes the device in embodiment 2. The electronic equipment provided by the embodiment of the present disclosure may be a mobile phone, a tablet computer or a digital camera. All embodiments and beneficial effects of the device are applicable to the electronic equipment.

The above is the preferred implementation mode of the present disclosure. It should be pointed out that those skilled in the art may further make a plurality of improvements and embellishments without departing from the principle of the present disclosure and these improvements and embellishments shall also fall within the scope of protection of the present disclosure.

INDUSTRIAL APPLICABILITY

As mentioned above, the method and device for displaying the SOC of the battery and electronic equipment provided by the embodiments of the present disclosure have the following beneficial effects: accurate calculation of the SOC of the battery of a terminal is implemented without an additional hardware circuit such as a voltameter chip, and cost is reduced; and meanwhile, no voltameter chip is used, so that a valuable PCB arrangement space in terminal equipment is saved, the cost is further reduced, and a degree of freedom of hardware design and competitiveness of a product are increased.

What is claimed is:

1. A method for displaying State-Of-Charge (SOC) of a battery, comprising:
    acquiring, by an SOC Management Integrated Circuit (PMIC), an initial voltage and initial SOC of the battery;
    acquiring, by the PMIC, a current voltage and a current SOC of the battery in a current state after charging or discharging the battery for a preset time; and
    if a ratio of the current voltage to the initial voltage meets a first preset condition and a ratio of the current SOC to the initial SOC meets a second preset condition, displaying the current voltage and the current SOC, wherein the first preset condition is a condition that a rise or drop value of the voltage of the battery within a period of time not exceed a first limit value, and the second preset condition is a condition that a rise or drop value of SOC of the battery within a period of time not exceed a second limit value;
    wherein acquiring the current voltage and current SOC of the battery in the current state after charging or discharging the battery for the preset time further comprises:
    acquiring, via the PMIC, the current voltage of the battery in the current state after charging or discharging the battery for the preset time; and
    acquiring the current SOC corresponding to the current voltage according to the preset corresponding relationship between the voltage and the SOC;
    wherein acquiring the current voltage and current SOC of the battery in the current state after charging the battery for the preset time further comprises:
    matching a difference value corresponding to the acquired current voltage according to a preset corresponding relationship between a difference value and a voltage;
    correcting, according to the matched difference value, the acquired current voltage to obtain a corrected current voltage; and
    acquiring the current SOC corresponding to the current voltage according to the preset corresponding relationship between the voltage and the SOC comprises:
    acquiring the current SOC corresponding to the corrected current voltage according to the preset corresponding relationship between the voltage and the SOC.

2. The method according to claim 1, further comprising:
    if the first preset condition is met and the second preset condition is not met, utilizing the current voltage meeting the first preset condition as a displayed voltage, and utilizing the second limit value as a displayed SOC.

3. The method according to claim 1, further comprising:
    if the second preset condition is met and the first preset condition is not met, utilizing the current SOC meeting the second preset condition as the displayed SOC, and utilizing the first limit value as the displayed voltage.

4. The method according to claim 1, wherein acquiring the initial voltage and initial SOC of the battery further comprises:
    acquiring the initial voltage of the battery through the PMIC; and acquiring the initial SOC corresponding to the initial voltage according to a preset corresponding relationship between a voltage and an SOC.

5. The method according to claim 1, in a charging stage of the battery, further comprising:
comparing the current SOC with the initial SOC;
if the current SOC is smaller than the initial SOC, continuously acquiring multiple current SOCs of the battery according to a preset period;
comparing the multiple current SOCs with the initial SOC; and
if all the multiple current SOCs are smaller than the initial SOC, displaying the latest current SOC.

6. The method according to claim 1, in a discharging stage of the battery, further comprising:
comparing the current SOC with the initial SOC;
if the current SOC is larger than the initial SOC, continuously acquiring multiple current SOCs of the battery according to a preset period;
comparing the multiple current SOCs with the initial SOC; and
if all the multiple current SOCs are larger than the initial SOC, displaying the latest current SOC.

7. A device for displaying State-Of-Charge (SOC) of a battery, comprising:
an SOC Management Integrated Circuit (PMIC), configured to acquire an initial voltage and initial SOC of the battery;
the PMIC is further configured to acquire a current voltage and a current SOC of the battery in a current state after charging or discharging the battery for a preset time; and
a display module, configured to, if a ratio of the current voltage to the initial voltage meets a first preset condition and a ratio of the current SOC to the initial SOC meets a second preset condition, display the current voltage and the current SOC, wherein the first preset condition is a condition that a rise or drop value of the voltage of the battery within a period of time not exceed a first limit value, and the second preset condition is a condition that a rise or drop value of SOC of the battery within a period of time not exceed a second limit value;
wherein the PMIC comprises:
a current voltage acquisition unit, configured to acquire the current voltage of the battery in the current state after charging or discharging the battery for the preset time; and
a current SOC acquisition unit, configured to acquire a current SOC corresponding to the current voltage according to the preset corresponding relationship between the voltage and the SOC;
wherein the PMIC further comprises:
a difference value acquisition unit, configured to match a difference value corresponding to the acquired current voltage according to a preset corresponding relationship between a difference value and a voltage;
a voltage correction unit, configured to correct, according to the matched difference value, the acquired current voltage to obtain a corrected current voltage; and
the current SOC acquisition unit is further configured to acquire a current SOC corresponding to the corrected current voltage according to the preset corresponding relationship between the voltage and the SOC.

8. The device according to claim 7, further comprising:
a voltage correction module, configured to, if the first preset condition is met and the second preset condition is not met, utilize the current voltage as a displayed voltage, and utilize the second limit value as a displayed SOC.

9. The device according to claim 7, further comprising:
an SOC correction module, configured to, if the second preset condition is met and the first preset condition is not met, utilize the first limit value as the displayed voltage, and utilize the current SOC as the displayed SOC.

10. The device according to claim 7, wherein the PMIC comprises:
an initial voltage acquisition unit, configured to acquire the initial voltage of the battery; and
an initial SOC acquisition unit, configured to acquire an initial SOC corresponding to the initial voltage according to a preset corresponding relationship between a voltage and an SOC.

11. The device according to claim 7, in a charging stage of the battery, further comprising:
a charging control module, configured to compare the current SOC with the initial SOC; if the current SOC is smaller than the initial SOC, continuously acquire multiple current SOCs of the battery according to a preset period;
compare the multiple current SOCs with the initial SOC; and if all the multiple current SOCs are smaller than the initial SOC, display the latest current SOC.

12. The device according to claim 7, in a discharging stage of the battery, further comprising:
a discharging control module, configured to compare the current SOC with the initial SOC; if the current SOC is larger than the initial SOC, continuously acquire multiple current SOCs of the battery according to a preset period;
compare the multiple current SOCs with the initial SOC; and if all the multiple current SOCs are larger than the initial SOC, display the latest current SOC.

13. An electronic equipment, comprising the device for displaying the SOC of the battery as claimed in claim 7.

14. An electronic equipment, comprising the device for displaying the SOC of the battery as claimed in claim 8.

15. An electronic equipment, comprising the device for displaying the SOC of the battery as claimed in claim 9.

16. An electronic equipment, comprising the device for displaying the SOC of the battery as claimed in claim 12.

* * * * *